United States Patent
Chen

(10) Patent No.: US 10,916,812 B2
(45) Date of Patent: Feb. 9, 2021

(54) ELECTRONIC DEVICE AND CHARGING METHOD

(71) Applicant: GETAC TECHNOLOGY CORPORATION, Hsinchu County (TW)

(72) Inventor: Li-Shing Chen, Taipei (TW)

(73) Assignee: GETAC TECHNOLOGY CORPORATION, Hsinchu County (TW)

(*) Notice: Subject to any disclaimer, the term of this patent is extended or adjusted under 35 U.S.C. 154(b) by 317 days.

(21) Appl. No.: 15/913,872

(22) Filed: Mar. 6, 2018

(65) Prior Publication Data
US 2019/0115629 A1 Apr. 18, 2019

(30) Foreign Application Priority Data
Oct. 13, 2017 (CN) .......................... 2017 1 0950123

(51) Int. Cl.
| | | |
|---|---|---|
| *H01M 10/42* | (2006.01) | |
| *H01M 10/48* | (2006.01) | |
| *H01M 10/44* | (2006.01) | |
| *G01R 31/36* | (2020.01) | |
| *G01R 31/382* | (2019.01) | |
| *G01R 31/392* | (2019.01) | |

(52) U.S. Cl.
CPC ...... *H01M 10/425* (2013.01); *G01R 31/3648* (2013.01); *G01R 31/382* (2019.01); *G01R 31/392* (2019.01); *H01M 10/441* (2013.01); *H01M 10/443* (2013.01); *H01M 10/482* (2013.01); *H01M 10/486* (2013.01); *H01M 2220/30* (2013.01)

(58) Field of Classification Search
CPC ............. H01M 10/425; H01M 10/486; H01M 10/443; H01M 10/441; H01M 10/482; H01M 2220/30; H01M 2010/4271; H01M 10/48; G01R 31/392; G01R 31/382; G01R 31/3648; H02J 7/007; H02J 7/0048
USPC .......................................... 320/132
See application file for complete search history.

(56) References Cited

U.S. PATENT DOCUMENTS

| | | | | |
|---|---|---|---|---|
| 7,202,635 B2* | 4/2007 | Patino | ..................... | H02J 7/008 320/160 |
| 7,619,417 B2* | 11/2009 | Klang | ................ | G01R 31/3648 324/427 |
| 7,633,265 B2* | 12/2009 | Matsushima | ............. | H02J 7/00 320/134 |
| 7,741,849 B2* | 6/2010 | Frey | ........................ | B60L 58/12 324/427 |
| 8,022,676 B2* | 9/2011 | Kano | ................... | H02J 7/00716 320/160 |
| 8,332,169 B2* | 12/2012 | Kang | ..................... | G01R 31/392 702/63 |
| 8,407,018 B2* | 3/2013 | White | ................... | G01R 31/392 702/63 |

(Continued)

*Primary Examiner* — M Baye Diao

(57) ABSTRACT

A charging method includes calculating a remained lifetime of a battery unit based on a health state and a battery temperature of the battery unit, charging the battery unit by a charging voltage with a first potential when the remained lifetime is higher than a lifetime threshold, and charging the battery unit by the charging voltage with a second potential when the remained lifetime is smaller than or equal to the lifetime threshold.

12 Claims, 5 Drawing Sheets

(56) References Cited

U.S. PATENT DOCUMENTS

| | | | | |
|---|---|---|---|---|
| 8,896,272 | B2* | 11/2014 | Hawawini | H01M 10/44 |
| | | | | 320/160 |
| 8,958,993 | B2* | 2/2015 | Maruyama | G05B 23/0283 |
| | | | | 702/34 |
| 9,085,238 | B2* | 7/2015 | Sisk | B60L 58/21 |
| 9,531,040 | B2* | 12/2016 | Osaka | H01M 10/482 |
| 9,658,290 | B2* | 5/2017 | Frison | G01R 31/3835 |
| 9,742,042 | B2* | 8/2017 | Wang | H01M 10/48 |
| 10,020,548 | B2* | 7/2018 | Yu | G01R 31/389 |
| 10,101,406 | B2* | 10/2018 | Park | G01R 31/392 |
| 10,422,836 | B2* | 9/2019 | Huang | G01R 31/392 |
| 10,446,885 | B2* | 10/2019 | Clarke | H02J 7/0069 |
| 10,459,034 | B2* | 10/2019 | Basu | G01R 31/367 |
| 10,712,395 | B2* | 7/2020 | Jiang | H01M 10/486 |
| 10,718,815 | B2* | 7/2020 | Kim | G01R 31/3842 |
| 2014/0084867 | A1* | 3/2014 | Hamaoka | H02J 7/02 |
| | | | | 320/116 |
| 2014/0207318 | A1* | 7/2014 | Sisk | B60L 58/12 |
| | | | | 701/22 |
| 2014/0266227 | A1* | 9/2014 | Harman | G07C 5/085 |
| | | | | 324/427 |
| 2014/0375278 | A1* | 12/2014 | Kim | H02J 7/0071 |
| | | | | 320/155 |
| 2015/0147614 | A1* | 5/2015 | Wang | G01N 27/4161 |
| | | | | 429/93 |
| 2017/0115355 | A1* | 4/2017 | Willard | G01R 31/392 |
| 2017/0214266 | A1* | 7/2017 | Takahashi | H02J 7/0019 |
| 2018/0183252 | A1* | 6/2018 | Kim | H01M 10/48 |
| 2018/0188329 | A1* | 7/2018 | Huang | G01R 31/3648 |
| 2018/0348304 | A1* | 12/2018 | Tang | G01R 31/382 |

\* cited by examiner

ELECTRONIC DEVICE AND CHARGING METHOD

CROSS REFERENCE TO RELATED APPLICATIONS

This Application claims priority of China Patent Application No. 201710950123.5 filed on Oct. 13, 2017, the entirety of which is incorporated by reference herein.

BACKGROUND OF THE INVENTION

Field of the Invention

The present invention relates to charging technologies and, more particularly, to an electronic device and a charging method which prolong the service life of a battery unit.

Description of the Prior Art

Along with technological advancement and development, various electronic devices are not only in increasingly wider use but are also designed and developed to manifest features, such as lightweight, compact, and portable. Therefore, portable electronic devices have become mainstream electronic devices. In general, to meet the requirement for portability, portable electronic devices usually use a chargeable battery unit as a main power source for maintaining their operation, thereby enhancing their practicability.

From an electrochemical perspective, a conventional battery unit is usually charged and discharged by oxidation-reduction (redox) reactions. The battery unit essentially comprises a cathode, an anode, a separation film, and an electrolyte. The electrolyte is filled between the cathode and the anode. The separation film separates the cathode and the anode to prevent contact, and thus creation of a short circuit, between the cathode and the anode.

During a charging process of the battery unit, the separation film therein is gradually thinned and weakened because of the pressure built up in the battery unit by electrochemical reactions, thereby shortening the service life of the battery unit. Furthermore, in case the battery unit has a short remaining lifetime, the thinning and weakening of the separation film will be especially severe, further predisposing the battery unit to a short circuit and even combustion, explosions and the like.

SUMMARY OF THE INVENTION

In an embodiment, a charging method comprises the steps of: calculating a remaining lifetime of a battery unit according to a battery temperature and a state of health (SOH) of the battery unit; charging the battery unit at a charging voltage with a first electric potential when the remaining lifetime is longer than a lifetime threshold; and charging the battery unit at a charging voltage with a second electric potential when the remaining lifetime is shorter than or equal to the lifetime threshold.

In an embodiment, an electronic device comprises a battery unit, a charging unit and a processing unit. The charging unit charges the battery unit. The processing unit calculates a remaining lifetime of the battery unit according to a battery temperature and a state of health (SOH) of the battery unit, causes the charging unit to charge the battery unit at a charging voltage with a first electric potential when the remaining lifetime is longer than a lifetime threshold, and causes the charging unit to charge the battery unit at a charging voltage with a second electric potential when the remaining lifetime is shorter than or equal to the lifetime threshold. The second electric potential is lower than the first electric potential.

In conclusion, an electronic device and a charging method according to an embodiment of the present invention have advantages as follows: calculating the remaining lifetime of a battery unit precisely according to the battery temperature and SOH of the battery unit, and reducing the electric potential of a charging voltage when the remaining lifetime is shorter than a lifetime threshold, thereby prolonging the service life of the battery unit appropriately.

A detailed description of fine features and advantages of the present invention is given below so that every person skilled in the art can understand and implement the technical contents of the present invention and readily comprehend the objectives and advantages thereof by reviewing the disclosure of the present specification, the appended claims, and the accompanying drawings.

DETAILED DESCRIPTION OF THE EMBODIMENTS

Figure 1:
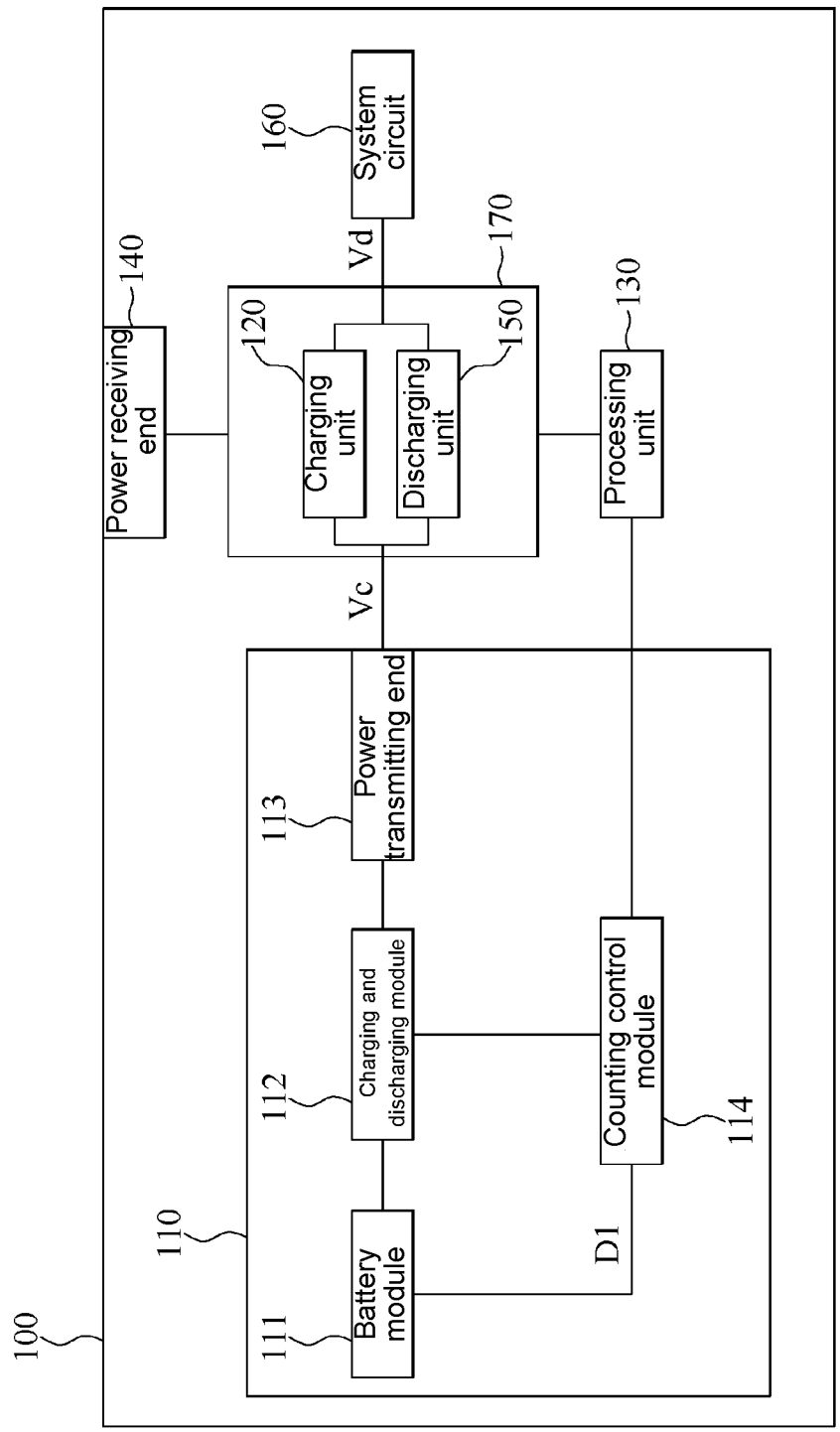
FIG. 1 is a block diagram of an electronic device according to an embodiment of the present invention.

FIG. 1 is a block diagram of an electronic device 100 according to an embodiment of the present invention. Referring to FIG. 1, the electronic device 100 comprises a battery unit 110, a charging unit 120 and a processing unit 130. The charging unit 120 is coupled to the battery unit 110. The processing unit 130 is coupled to the battery unit 110 and the charging unit 120.

The battery unit 110 stores power and supplies the stored battery power to the electronic device 100; hence, the battery unit 110 serves as one of power sources for maintaining the operation of the electronic device 100. In an embodiment, the battery unit 110 comprises a battery module 111, a charging and discharging module 112, a power transmitting end 113 and a counting control module 114. The charging and discharging module 112 is coupled between the power transmitting end 113 and the battery module 111. The counting control module 114 is coupled to the battery module 111 and the charging and discharging module 112.

The battery module 111 is electrically connected to the power transmitting end 113 through a charging link path created by the charging and discharging module 112 and thus charged through the power transmitting end 113. Alternatively, the battery module 111 is electrically connected to the power transmitting end 113 through a discharging link path created by the charging and discharging module 112 and thus discharged through the power transmitting end 113.

In an embodiment, the battery module 111 is a single battery cell. In another embodiment, the battery module 111 is a battery which comprises a plurality of battery cells, and the battery cells are series-connected or parallel-connected according to power supply specifications of the battery unit 110. In some embodiments, the battery module 111 is a lithium-ion battery, a lithium phosphate battery, a lithium polymer battery, a nickel-cadmium battery, a lead-acid battery or any type of battery suitable for undergoing secondary charging.

The counting control module 114 controls the creation of the charging and discharging link paths of the charging and discharging module 112. In an embodiment, the charging and discharging module 112 comprises one or more switch components. In some embodiments, the switch components are transistors. For instance, the charging and discharging module 112 comprises two transistors. The two transistors are series-connected to the battery module 111 and the power transmitting end 113. Control ends of the two transistors are coupled to the counting control module 114, allowing the two transistors to create a charging link path or a discharging link path disposed between the battery module 111 and the power transmitting end 113 according to a control signal from the counting control module 114.

The counting control module 114 assesses use-related information D1 of the battery module 111. In some embodiments, use-related information D1 comprises power level data, current maximum electrical capacity, battery temperature, and/or number of charging and discharging cycles of the battery module 111.

In an embodiment, the battery module 111, the charging and discharging module 112 and the counting control module 114 of the battery unit 110 are disposed in a battery casing, whereas the counting control module 114 detects the battery temperature by sensing ambient temperature in the battery casing. In another embodiment, the counting control module 114 is electrically connected to at least one of the battery cells of the battery module 111 in order to detect the battery temperature. For instance, the counting control module 114 is electrically connected to a nearby battery cell in order to detect the battery temperature.

In an embodiment, the counting control module 114 detects power level data of the battery module 111 by open-circuit voltage method or coulomb counting method, with the power level data being indicative of the power level of the battery unit 110, as expressed by relative state of capacity (RSOC), but the present invention is not limited thereto.

In some embodiments, the counting control module 114 is a gauge integrated circuit (gauge IC), but the present invention is not limited thereto.

In an embodiment, the electronic device 100 further comprises a power receiving end 140, such that the charging unit 120 is coupled between the power receiving end 140 and the battery unit 110. The power receiving end 140 receives external power. The charging unit 120 is controlled by the processing unit 130. Under the control of the processing unit 130, the charging unit 120 converts external power received by the power receiving end 140 into a charging voltage Vc corresponding in electric potential to the external power, and then charges the battery module 111 at the charging voltage Vc through the power transmitting end 113 of the battery unit 110.

In an embodiment, the electronic device 100 further comprises a discharging unit 150 and a system circuit 160. The discharging unit 150 is coupled between the battery unit 110 and the system circuit 160. The discharging unit 150 is controlled by the processing unit 130. Under the control of the processing unit 130, the discharging unit 150 converts battery power from the battery unit 110 into a supply voltage Vd corresponding in electric potential to the battery power, and then supplies power to the system circuit 160 at the supply voltage Vd.

In some embodiments, the charging unit 120 and the discharging unit 150 are integrated into a charging and discharging system chip 170 by an integration process technology.

Figure 2:
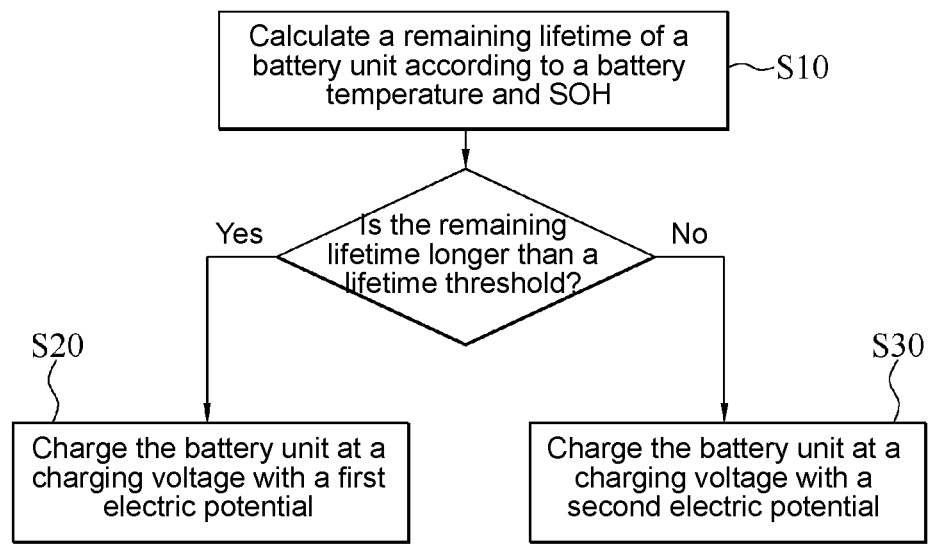
FIG. 2 is a flowchart of a charging method according to an embodiment of the present invention.

FIG. 2 is a flowchart of a charging method according to an embodiment of the present invention. Referring to FIG. 1 and FIG. 2, the processing unit 130 calculates the remaining lifetime of the battery unit 110 by the charging method of any embodiment of the present invention and controls the magnitude of the electric potential of the charging voltage Vc of the charging unit 120 charging the battery unit 110 to prolong the service life of the battery unit 110.

In an embodiment, the processing unit 130 carries out the charging method according to any embodiment of the present invention as soon as the processing unit 130 detects that the electronic device 100 is going to charge the battery unit 110, for example, when the processing unit 130 detects that the power receiving end 140 of the electronic device 100 receives the external power.

In an embodiment of the charging method, the processing unit 130 calculates the remaining lifetime of the battery unit 110 according to the battery temperature and the state of health (SOH) of the battery unit 110 (step S10). If the calculated remaining lifetime is longer than a lifetime threshold of the battery unit 110, the processing unit 130 causes the charging unit 120 to convert the external power into the charging voltage Vc with a first electric potential and then causes the charging unit 120 to charge the battery unit 110 at the charging voltage Vc with the first electric potential (step S20). If the calculated remaining lifetime is shorter than or equal to the lifetime threshold of the battery unit 110, the processing unit 130 causes the charging unit 120 to convert the external power into the charging voltage Vc with a second electric potential and then causes the charging unit 120 to charge the battery unit 110 at the charging voltage Vc with the second electric potential (step S30). The second electric potential is lower than the first electric potential.

In some embodiments, the first electric potential is the fully-charged electric potential of the battery unit 110, say, 4.2 V, whereas the second electric potential equals 97% to 98% of the first electric potential, say, 4.1 V, but the present invention is not limited thereto.

Figure 3:
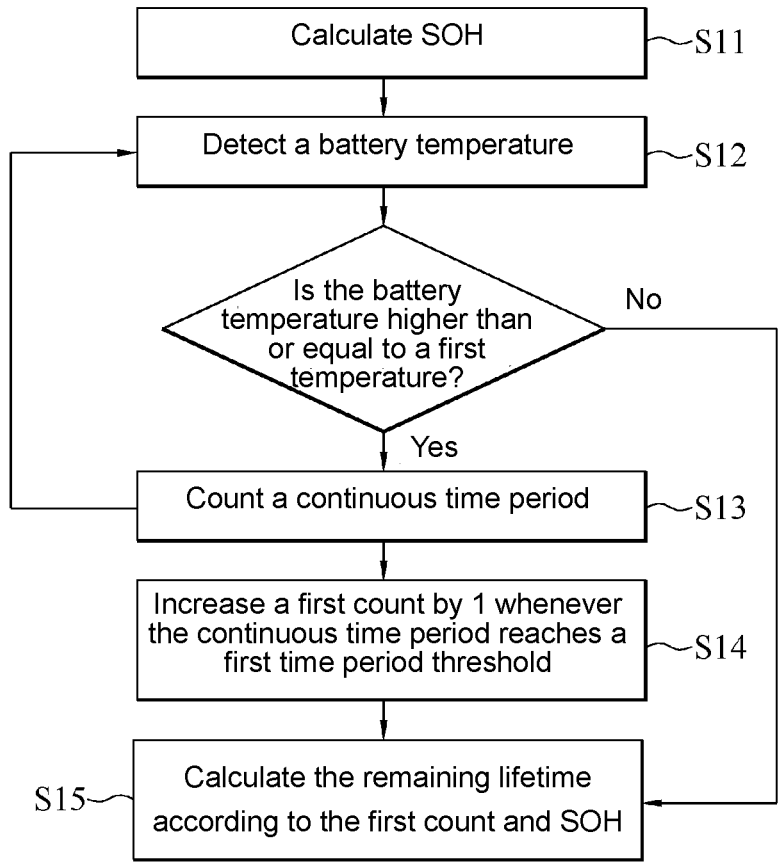
FIG. 3 is a flowchart of an embodiment of step S10 in FIG. 2.

FIG. 3 is a flowchart of an embodiment of step S10 in FIG. 2. Referring to FIG. 1 through FIG. 3, in an embodiment of step S10, the processing unit 130 causes the counting control module 114 to identify use-related information D1 of the battery module 111, calculate the SOH of the battery module 111 according to use-related information D1 (step S11), and detect the battery temperature of the battery module 111 according to use-related information D1 (step S12).

In an embodiment of step S11, the processing unit 130 expresses the SOH of the battery module 111 in terms of the number of charging and discharging cycles as stated in use-related information D1. In general, the smaller the number of charging and discharging cycles is recorded in use-related information D1, the healthier is the SOH of the battery module 111.

In another embodiment of step S11, the processing unit 130 calculates the SOH of the battery module 111 in accordance with current maximum electrical capacity as stated in use-related information D1. The current maximum electrical capacity is the maximum electrical capacity which can be released by the battery module 111 and identified by the counting control module 114 after the battery module 111 has been fully charged. For instance, the processing unit 130 expresses the SOH as current maximum electrical capacity to rated electrical capacity ratio in percentage. In general, a current maximum electrical capacity to rated electrical capacity ratio of 100% indicates that the SOH of the battery module 111 which is new. The larger the current maximum electrical capacity to rated electrical capacity ratio is, the healthier the SOH of the battery module 111 is.

In an embodiment of step S10, after the processing unit 130 has detected the battery temperature of the battery module 111, if the battery temperature detected by the processing unit 130 is higher than or equal to a first temperature, the processing unit 130 starts to count a continuous time period of the situation (that is, the situation where the battery temperature is higher than or equal to the first temperature) (step S13) and increases a first count by 1 whenever the continuous time period reaches a first time period threshold (step S14). The processing unit 130 calculates the remaining lifetime of the battery module 111 according to the cumulative first count and the SOH of the battery module 111 (step S15).

In some embodiments, the first temperature ranges from 45° C. to 50° C., whereas the first time period threshold is any positive integer whose quantity is measured as common time units of second, minute and hour, for example.

For instance, given a first temperature of 45° C. and a first time period threshold of 1 hour, assuming the initial value of a first count is 0, the processing unit 130 executes step S13 as soon as the processing unit 130 detects that the battery temperature is higher than or equal to 45° C., so as to start counting the continuous time period of the situation. In some embodiments, after starting to count the continuous time period, the processing unit 130 executes step S11 repeatedly according to a predetermined frequency so as to continuously monitor the battery temperature of the battery module 111. If the battery temperature detected by the processing unit 130 while the processing unit 130 is executing step S11 repeatedly is still higher than or equal to 45° C., the processing unit 130 keeps counting the continuous time period of the situation. The processing unit 130 executes step S14 to increase the first count by 1 whenever the continuous time period of the situation reaches 1 hour. For instance, if the continuous time period of the situation reaches 4 hours, the cumulative first count in step S14 is 4. If the battery temperature detected by the processing unit 130 while the processing unit 130 is executing step S11 repeatedly is lower than 45° C., the processing unit 130 stops counting the continuous time period and zeroes the continuous time period of the situation.

In some embodiments, the processing unit 130 zeroes the continuous time period without eliminating the cumulative first count. Therefore, the processing unit 130 increases the first count by 1 whenever the processing unit 130 detects that the battery temperature is higher than or equal to the first temperature and that the continuous time period reaches the first time period threshold.

Figure 4:
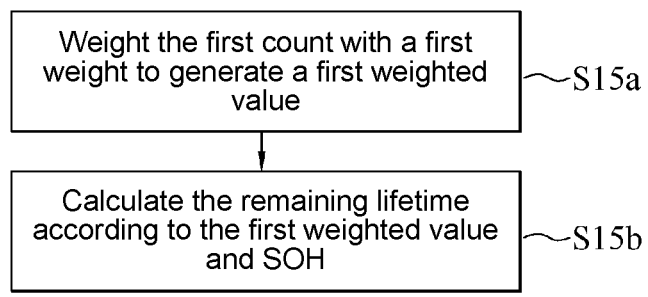
FIG. 4 is a flowchart of an embodiment of step S15 in FIG. 3.

FIG. 4 is a flowchart of an embodiment of step S15 in FIG. 3. Referring to FIG. 1 through FIG. 4, in an embodiment of step S15, the processing unit 130 weights the cumulative first count with a first weight to generate a first weighted value (step S15a). Afterward, the processing unit 130 calculates the remaining lifetime of the battery module 111 according to the first weighted value and the SOH of the battery module 111 (step S15b).

In some embodiments, the first weight is any positive integer. The first weight is set according to battery characteristics of the battery module 111.

In an embodiment of step S15a, if the cumulative first count and the first weight in step S14 are 4 and 0.1, respectively, the processing unit 130 multiplies the first weight and the first count and thereby calculates the first weighted value to be 0.4.

In an embodiment of step S15b, when the SOH of the battery module 111 is expressed in percentage and equals, say, 80%, the processing unit 130 subtracts the first weighted value from the SOH to detect the remaining lifetime, and thus the remaining lifetime detected by the processing unit 130 is 79.6%. In another embodiment of step S15b, when the SOH of the battery module 111 is expressed in the number of charging and discharging cycles and equals, say, 300, the processing unit 130 adds the first weighted value to the SOH to detect the remaining lifetime, and thus the remaining lifetime detected by the processing unit 130 is 300.4.

In an embodiment of step S10, upon detection of the battery temperature of the battery module 111, if the battery temperature detected by the processing unit 130 is lower than the first temperature, the processing unit 130 executes step S15. If the first count is still 0, the processing unit 130 uses the SOH as the remaining lifetime of the battery module 111 in step S15.

Figure 5:
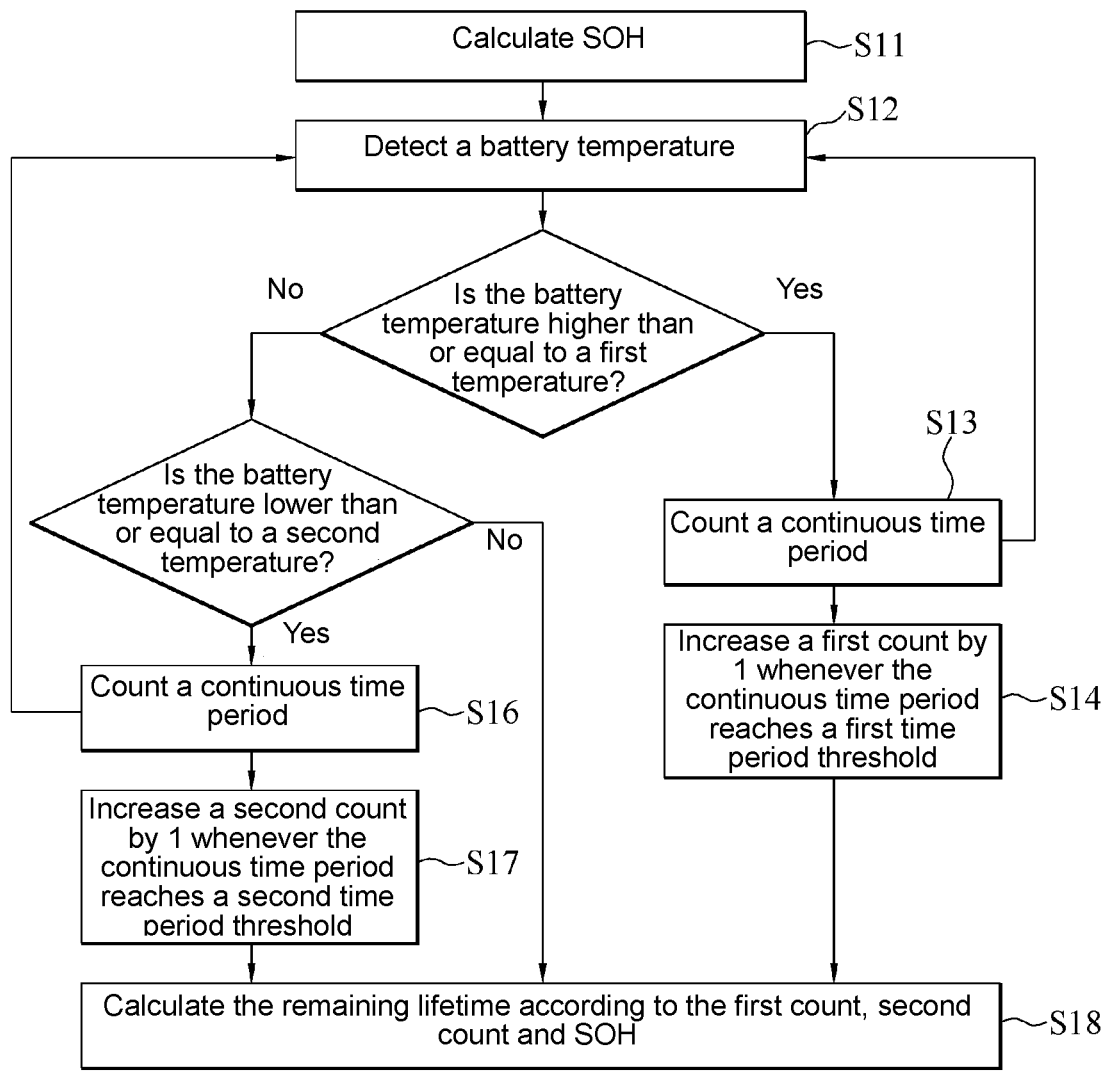
FIG. 5 is a flowchart of another embodiment of step S10 in FIG. 2.

FIG. 5 is a flowchart of another embodiment of step S10 in FIG. 2. Referring to FIG. 1 through FIG. 5, in another embodiment of step S10, the processing unit 130 starts to count a continuous time period of the situation where the battery temperature is higher than or equal to the first temperature (step S13), increases a first count by 1 whenever the continuous time period reaches a first time period threshold (step S14), starts to count a continuous time period of the situation where the battery temperature is lower than or equal to the second temperature (step S16), and increases a second count by 1 whenever the continuous time period reaches a second time period threshold (step S17). The second temperature is lower than the first temperature. The processing unit 130 calculates the remaining lifetime of the battery module 111 according to the cumulative first count, the cumulative second count and the SOH of the battery module 111 (step S18).

In some embodiments, the second temperature ranges from 0° C. to −20° C., whereas the second time period threshold is any positive integer whose quantity is measured as common time units of second, minute and hour, for example. Furthermore, the second time period threshold may equal the first time period threshold.

Step S13 and step S14 are substantially the same as their counterparts above and thus are not described again for the sake of brevity. In an embodiment, given a second temperature of −20° C. and a second time period threshold of 1 hour, assuming the initial value of a second count is 0, the processing unit 130 executes step S16 as soon as the processing unit 130 detects that the battery temperature is lower than or equal to −20° C., so as to start counting the continuous time period of the situation. Similarly, after executing step S16, the processing unit 130 executes step S11 repeatedly according to a predetermined frequency so as to continuously monitor the battery temperature of the battery module 111. If the battery temperature detected by the processing unit 130 while the processing unit 130 is executing step S11 repeatedly is still lower than or equal to −20° C., the processing unit 130 keeps counting the continuous time period of the situation. The processing unit 130 increases the second count by 1 whenever the continuous time period of the situation reaches 1 hour. For instance, if the continuous time period of the situation reaches 8 hours, the cumulative second count in step S17 is 8. If the battery temperature detected by the processing unit 130 while the processing unit 130 is executing step S11 repeatedly is higher than −20° C., the processing unit 130 stops counting the continuous time period and zeroes the continuous time period.

In some embodiments, the processing unit 130 zeroes the continuous time period without eliminating the cumulative second count. Therefore, the processing unit 130 increases the second count by 1 whenever the processing unit 130 detects that the battery temperature is lower than or equal to the second temperature and that the continuous time period reaches the second time period threshold.

Figure 6:
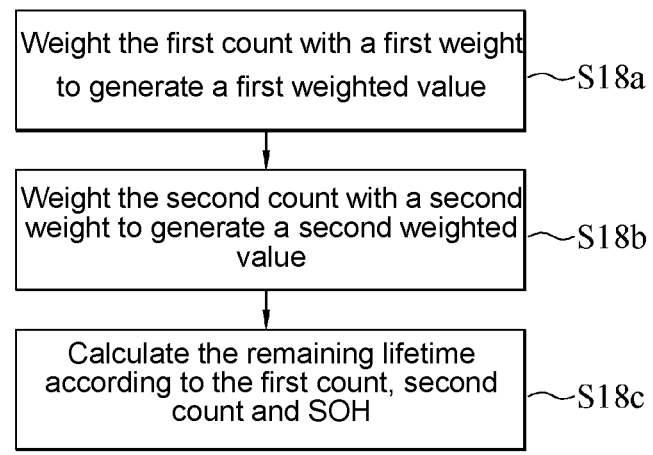
FIG. 6 is a flowchart of an embodiment of step S18 in FIG. 5.

FIG. 6 is a flowchart of an embodiment of step S18 in FIG. 5. Referring to FIG. 1 through FIG. 6, in an embodiment of step S18, the processing unit 130 weights the cumulative first count with a first weight to generate a first weighted value (step S18a), weights the cumulative second count with a second weight to generate a second weighted value (step S18b), and calculates the remaining lifetime of the battery module 111 according to the first weighted value, the second weighted value and the SOH of the battery module 111 (step S18c).

In some embodiments, the first weight and the second weight are any positive integers. The first weight and the second weight are set according to battery characteristics of the battery unit 110, for example, set according to expansion coefficient of the battery unit 110.

In an embodiment of step S18a, if the cumulative first count and the first weight in step S14 are 2 and 0.1, respectively, the processing unit 130 multiplies the first weight and the first count and thereby calculates the first weighted value to be 0.2. In an embodiment of step S18b, if the cumulative second count and the second weight in step S17 are 3 and 0.05, respectively, the processing unit 130 multiplies the second weight and the second count and thereby calculates the second weighted value to be 0.15.

In an embodiment of step S18c, when the SOH of the battery module 111 is expressed in percentage and equals, say, 70%, the processing unit 130 subtracts the first weighted value and the second weighted value from the SOH to detect the remaining lifetime, and thus the remaining lifetime detected by the processing unit 130 is 69.65%. In another embodiment of step S18c, when the SOH of the battery module 111 is expressed in the number of charging and discharging cycles and equals, say, 500, the processing unit 130 adds the first weighted value and the second weighted value to the SOH to detect the remaining lifetime, and thus the remaining lifetime detected by the processing unit 130 is 500.35.

In another embodiment of step S10, if the battery temperature detected by the processing unit 130 is lower than the first temperature but higher than the second temperature, the processing unit 130 executes step S18. If the first count and the second count are still 0, the processing unit 130 uses the SOH as the remaining lifetime of the battery module 111 in step S18.

In some embodiments, the lifetime threshold of the battery unit 110 (or the battery module 111) is 70% (when expressed in percentage) or 500 (when expressed by the number of charging and discharging cycles), but the present invention is not limited thereto.

In some embodiments, the processing unit 130 is a microcontroller (MCU), a central processing unit (CPU) or a system chip capable of computation, but the present invention is not limited thereto.

In conclusion, an electronic device and a charging method according to an embodiment of the present invention have advantages as follows: calculating the remaining lifetime of a battery unit precisely according to the battery temperature and SOH of the battery unit, and reducing the electric potential of a charging voltage when the remaining lifetime is shorter than a lifetime threshold, thereby prolonging the service life of the battery unit appropriately.

Although the present invention is disclosed above by preferred embodiments, the preferred embodiments are not restrictive of the present invention. Changes and modifications made by persons skilled in the art to the preferred embodiments without departing from the spirit of the present invention must be deemed falling within the scope of the present invention. Accordingly, the legal protection for the present invention should be defined by the appended claims.

What is claimed is:

1. A charging method, comprising the steps of:
   calculating, by a processing unit, a remaining lifetime of a battery unit according to a battery temperature and a state of health (SOH) of the battery unit;
   charging, by a charging unit under control of the processing unit, the battery unit at a charging voltage with a first electric potential when the remaining lifetime is longer than a lifetime threshold; and
   charging, by the charging unit under control of the processing unit, the battery unit at a charging voltage with a second electric potential when the remaining lifetime is shorter than or equal to the lifetime threshold, wherein the second electric potential is lower than the first electric potential.

2. The charging method of claim 1, wherein the step of calculating the remaining lifetime of the battery unit according to the battery temperature and the SOH of the battery unit comprises:
   detecting the battery temperature;
   increasing a first count by 1 whenever the battery temperature is higher than or equal to a first temperature and a continuous time period reaches a first time period threshold;
   calculating the SOH; and
   calculating the remaining lifetime according to the first count and the SOH.

3. The charging method of claim 2, wherein the step of calculating the remaining lifetime of the battery unit according to the battery temperature and the SOH of the battery unit further comprises increasing a second count by 1 whenever the battery temperature is lower than or equal to a second temperature and the continuous time period reaches a second time period threshold, with the second temperature being lower than the first temperature, and the step of calculating the remaining lifetime of the battery unit according to the first count and the SOH of the battery unit further comprises calculating the remaining lifetime of the battery unit according to the first count, the second count and the SOH of the battery unit.

4. The charging method of claim 2, wherein the step of calculating the remaining lifetime of the battery unit according to the first count and the SOH of the battery unit further comprises:
   weighting the first count with a first weight to generate a first weighted value; and
   calculating the remaining lifetime according to the SOH and the first weighted value.

5. The charging method of claim 3, wherein the step of calculating the remaining lifetime of the battery unit according to the first count, the second count and the SOH of the battery unit comprises:
   weighting the first count with a first weight to generate a first weighted value;
   weighting the second count with a second weight to generate a second weighted value; and
   calculating the remaining lifetime according to the SOH, the first weighted value and the second weighted value.

6. The charging method of claim 2, wherein the step of calculating the SOH is performed according to current maximum electrical capacity to rated electrical capacity ratio in percentage and/or a number of charging and discharging cycles.

7. An electronic device, comprising:
   a battery unit;
   a charging unit for charging the battery unit; and
   a processing unit for calculating a remaining lifetime of the battery unit according to a battery temperature and a state of health (SOH) of the battery unit, causing the charging unit to charge the battery unit at a charging voltage with a first electric potential when the remaining lifetime is longer than a lifetime threshold, and causing the charging unit to charge the battery unit at a charging voltage with a second electric potential when the remaining lifetime is shorter than or equal to the lifetime threshold, wherein the second electric potential is lower than the first electric potential.

8. The electronic device of claim 7, wherein the processing unit increases a first count by 1 whenever the processing unit detects that the battery temperature is higher than or equal to a first temperature and a continuous time period reaches a first time period threshold, such that the processing unit calculates the remaining lifetime according to the first count and the SOH.

9. The electronic device of claim 8, wherein the processing unit increases a second count by 1 whenever the processing unit detects that the battery temperature is lower than or equal to a second temperature and the continuous time period reaches a second time period threshold, such that the processing unit calculates the remaining lifetime according to the first count, the second count and the SOH, with the second temperature being lower than the first temperature.

10. The electronic device of claim 8, wherein the processing unit weights the first count with a first weight to generate a first weighted value and calculates the remaining lifetime according to the SOH and the first weighted value.

11. The electronic device of claim 9, wherein the processing unit weights the first count with a first weight to generate a first weighted value, weights the second count with a second weight to generate a second weighted value, and calculates the remaining lifetime according to the SOH, the first weighted value and the second weighted value.

12. The electronic device of claim 8, wherein the processing unit calculates the SOH according to current maximum electrical capacity to rated electrical capacity ratio in percentage and/or a number of charging and discharging cycles.

* * * * *